United States Patent
Franke

(10) Patent No.: US 9,166,145 B2
(45) Date of Patent: Oct. 20, 2015

(54) MAGNETIC FIELD SENSOR DEVICE

(71) Applicant: Micronas GmbH, Freiburg (DE)

(72) Inventor: Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 18 days.

(21) Appl. No.: 14/287,559

(22) Filed: May 27, 2014

(65) Prior Publication Data

US 2014/0346579 A1    Nov. 27, 2014

(30) Foreign Application Priority Data

May 24, 2013  (DE) .................. 10 2013 008 794

(51) Int. Cl.
 *H01L 43/06*  (2006.01)
 *H01L 23/552* (2006.01)
 *H01L 27/22*  (2006.01)
 *G01R 33/07*  (2006.01)

(52) U.S. Cl.
 CPC .............. *H01L 43/065* (2013.01); *G01R 33/07* (2013.01); *H01L 23/552* (2013.01); *H01L 27/22* (2013.01)

(58) Field of Classification Search
 CPC ......... H01L 27/22; H01L 43/04; H01L 43/06; H01L 43/064; H01L 43/14; G01R 33/07–33/077
 See application file for complete search history.

(56) References Cited

U.S. PATENT DOCUMENTS

| | | | |
|---|---|---|---|
| 5,883,564 A * | 3/1999 | Partin ........................... | 338/32 R |
| 2005/0231197 A1 | 10/2005 | Reininger et al. | |
| 2009/0080118 A1* | 3/2009 | Gurney et al. ................ | 360/313 |
| 2009/0137066 A1* | 5/2009 | Imai et al. .......................... | 438/3 |
| 2010/0188782 A1 | 7/2010 | Yamazaki | |
| 2011/0037464 A1* | 2/2011 | Gurney et al. ................ | 324/252 |
| 2011/0089404 A1 | 4/2011 | Marcus et al. | |
| 2011/0233513 A1 | 9/2011 | Dimitrakopoulos et al. | |
| 2011/0267048 A1* | 11/2011 | Bratkovski et al. ........... | 324/244 |

FOREIGN PATENT DOCUMENTS

DE        202 11 518 U1    10/2002

* cited by examiner

*Primary Examiner* — Bryan Junge
(74) *Attorney, Agent, or Firm* — Muncy, Geissler, Olds & Lowe, P.C.

(57) ABSTRACT

A magnetic field sensor device having a semiconductor body, whereby the semiconductor body has a top side and a bottom side, and whereby the semiconductor body has a substrate layer and a passivation layer formed above the substrate on the top side of the semiconductor body, and one or more integrated electronic components are formed in the substrate layer of the semiconductor body, and a Hall plate is provided on the top side of the semiconductor body above the passivation layer, and the Hall plate is formed of a graphene compound.

16 Claims, 2 Drawing Sheets

MAGNETIC FIELD SENSOR DEVICE

This nonprovisional application claims priority, under 35 U.S.C. §119(a) to German Patent Application No. 10 2013 008 794.5, which was filed in Germany on May 24, 2013, and which is herein incorporated by reference.

BACKGROUND OF THE INVENTION

1. Field of the Invention
The invention relates to a magnetic field sensor device.
2. Description of the Background Art
DE 202 11 518 U1, which corresponds to US2005231197, and which discloses a magnetic field sensor device with a Hall plate.

SUMMARY OF THE INVENTION

It is therefore an object of the invention to provide a device that refines the prior art.

According to an embodiment of the invention, a magnetic field sensor device having a semiconductor body is provided, whereby the semiconductor body has a top side and a bottom side, and whereby the semiconductor body has a substrate layer and a passivation layer formed above the substrate on the top side of the semiconductor body, and one or more preferably integrated electronic components are formed in the substrate layer of the semiconductor body, and a Hall plate is provided on the top side of the semiconductor body above the passivation layer, and the Hall plate has a graphene compound. It should be noted that the graphene compound is formed preferably as a continuous layer and hereby the layer is arranged substantially parallel to the top side directly above the passivation layer. It is understood that the top side of the semiconductor body is preferably formed planar, particularly below the graphene layer. It should be noted further that the magnetic field sensor device is an integrated design in that the Hall plate is electrically connected to the semiconductor body. It is understood that a Hall plate generates a Hall voltage, provided an operating current flows through the Hall plate and part of the magnetic flux penetrates the surface of the Hall plate perpendicularly. Preferably, the ratio of the size of the lateral dimension of the graphene layer to the thickness of the graphene layer is greater than 50; i.e., the graphene layer is made as a thin layer.

An advantage of the magnetic field sensor device of the invention is that the Hall plate can be made simply and cost-effectively from the graphene compound. Tests have shown that because of the high mobility of the charge carriers in the graphene compound a Hall voltage results at low magnetic fluxes as well and a sensitive magnetic field sensor device can be produced. It is evident that there is an interaction between the type of layer formed directly below the graphene compound and the graphene layer, in that certain layers reduce more greatly the charge carrier mobility within the graphene compound than other types of layers. It is preferred to form particular types of layers directly below the graphene layer, which reduce the charge carrier mobility within the graphene layer as little as possible. It is especially preferred to form a gap between the graphene layer and the substrate to reduce the charge carrier mobility in the graphene layer or in the Hall plate not at all or as little as possible.

In an embodiment, the Hall plate has four spaced-apart contacts, whereby the Hall plate is electrically connected to the substrate layer by means of the contacts. It is preferred to arrange the contacts at the edges of the graphene layer. In one embodiment, the Hall plate comprises a two-dimensional graphene layer, so that a current flow occurs substantially parallel to the layer plane. The Hall plate comprises one or more graphene monolayers. It is understood that in the embodiment with a monolayer the current flow flows exclusively within the monolayer and hereby parallel to the substrate layer. Tests have shown that a low-defect formation of the graphene layer for the Hall plate with a high charge carrier mobility parallel to the plane of the carbon-containing layer produces a high Hall voltage even at low magnetic flux strengths. Preferably, the two-dimensional Hall plate formed as a graphene layer comprises a range between 1 and 20 atomic layers, whereby the charge carrier transport occurs in one atomic layer or in a plurality of atomic layers. Most preferably, the two-dimensional layer comprises precisely one atomic layer, whereby the charger carrier transport occurs in only one atomic layer.

In a further embodiment, a graphene monolayer or a plurality of graphene monolayers and/or a silicon-boron-nitride layer or a plurality of silicon-boron-nitride layers are arranged between the Hall plate and the passivation layer. It is understood that the graphene monolayers or the silicon-boron-nitride layers arranged below the Hall plate are not part of the Hall plate.

In a further embodiment, a graphene monolayer or a plurality of graphene monolayers and/or a silicon-boron-nitride layer or a plurality of silicon-boron-nitride layers are arranged above the Hall plate. The graphene monolayers or the silicon-boron-nitride layers can be arranged above or on the Hall plate and are not part of the Hall plate.

In one embodiment, the semiconductor body has silicon or a silicon compound. It is preferred that the trace layers comprise a silicon dioxide compound and metal surfaces, and the passivation layer comprises a silicon-boron-nitride compound and/or a silicon-nitride layer or includes one or more of the recited layers. In a further refinement, it is preferred to form an electrically conductive shielding layer within the trace layers or within the substrate layer, i.e., below the Hall plate. The electrically conductive layer is preferably connected to ground or to a reference potential. In one embodiment, within the trace layers it is preferred for forming the shielding layer to make one or more of the metal traces flat and hereby to form a cover layer. The Hall plate can be covered with a metallic cover plate on the side facing away from the substrate layer. Tests have shown that it is advantageous to shield the Hall plate electrically at least on one side but preferably on both sides. It is preferred further that there is an electrical functional connection between the shielding layer and a circuit unit and in particular the shielding layer is formed as a control electrode for influencing the sensitivity of the Hall plate, in that the level of the potential in the shielding layer is changed by means of the circuit unit.

An advantage of the electrical connection of the metallic layer and/or the cover plate to ground and/or the reference potential is that the operating point of the Hall plate can be set by a change in the voltage level of ground and/or the reference potential. In particular, whether the Hall voltage in the Hall plate is generated by electrons or by holes can be set in the metallic layer and/or in the cover plate by means of the voltage level. Further, the level of the voltage in the metallic layer and/or in the cover plate can be changed by means of a circuit unit in order to thereby reduce or completely compensate a temperature response of the Hall plate. A further advantage is that parasitic electrical fields and the effect of the parasitic fields on the Hall plate can be suppressed and the sensitivity of the Hall plate increased or reduced by means of the metallic layer and/or the cover plate. It should be noted that instead of the influencing of the Hall plate by means of the level or change in the level of ground in the metallic layer, a working potential can be applied to the substrate layer. It is disadvantageous hereby that the electronic components formed in the substrate layer are affected. Further, the Hall plate can be protected from an effect of the molding compound or potting compound in a subsequent molding process by means of the arrangement of the cover plate.

In an embodiment, the electronic components comprise MOS transistors, whereby the MOS transistors have an electrical functional connection to the Hall plate. In a refinement, the electronic components form a control unit. Further, it is preferred to attach the Hall plate solely at an edge region and to connect it electrically particularly at the edge region. The Hall plate can be connected electrically to the control unit, whereby the control unit is formed as an integrated circuit within the substrate. As a result, the control unit is integrated monolithically.

In an embodiment, the semiconductor body is arranged force-fittingly with its bottom side on a metallic support plate, whereby the support plate is generally also called a lead frame. It is preferred further to arrange the semiconductor body and the Hall plate in a mutual IC package.

In an embodiment, two Hall plates or three Hall plates are provided on the semiconductor body, whereby the Hall plates are arranged preferably orthogonal to one another. It is preferred to form a Hall plate parallel to the top side of the support.

The invention will be described in greater detail below with reference to the drawings. In this respect, similar parts are labeled with identical designations. The illustrated embodiments are highly schematized; i.e., the distances and the lateral and vertical extension are not to scale and, if not otherwise indicated, also do not have any derivable geometric relation to one another. Shown are:

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
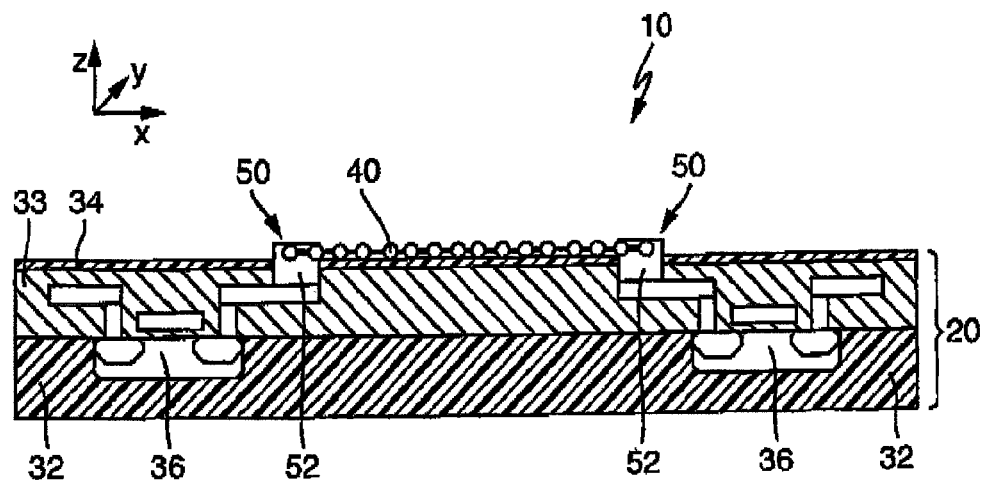
FIG. 1 is a cross-sectional view of a first embodiment of a magnetic field sensor device.

The illustration in FIG. 1 shows a first cross-sectional view of a first embodiment, having a magnetic field sensor device 10 with a semiconductor body 20 with a top side 24 and a bottom side 28. For the sake of clarity, a Cartesian coordinate system is drawn in, whereby the cross section is formed along an x-z-plane. A substrate layer 32 and a passivation layer 34 arranged above substrate layer 32 are formed on top side 24 of semiconductor body 20. Semiconductor body 20 comprises preferably a silicon compound and semiconductor body 20 is formed of silicon. In contrast, passivation layer 34 comprises a silicon dioxide compound and/or a boron-nitride compound and/or a nitride compound and/or a polyimide compound. A plurality of electronic components 36 is formed in substrate layer 32, whereby electronic components 36, as depicted, also comprise MOS transistors. Preferably, electronic components 36 form an integrated circuit in the form of a control unit (not shown). Further, a Hall plate 40 is arranged on top side 24 of semiconductor body 20 above passivation layer 34. Hall plate 40 is formed of a graphene layer formed parallel to the x-y-plane, whereby the graphene layer is formed preferably as a monolayer i.e., as a two-dimensional layer. As a result, a current flow occurs only in the monolayer. Hall plate 40 preferably has a rectangular form in the x-y-plane; most preferably Hall plate 40 is made square. A contact area 50 is formed at each of the four outer edges. In the present case, two of the contract areas 50 are shown. Hall plate 40 is fixed mechanically and electrically connected to contact areas 50. Contact areas 50 in each case have a contact 52 for the electrical connection to substrate area 32. Preferably, Hall plate 40 is connected by means of electrical contacts 52 to the control unit. Hall plate 40 is supplied via two contacts 52 with an operating current by means of the control unit, whereas a Hall voltage is removed and supplied to the control unit by means of the two other contacts 52, provided part of a magnetic flux penetrates the x-y-plane of Hall plate 40 perpendicularly.

Figure 2:
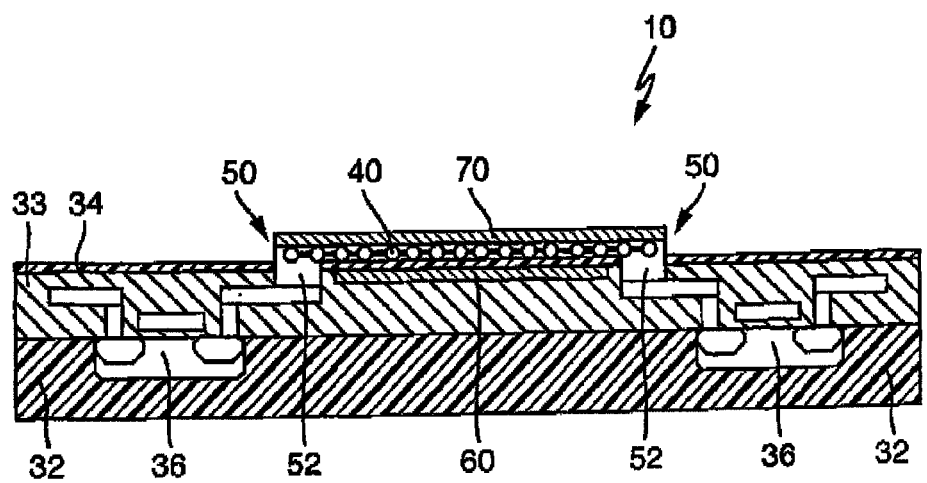
FIG. 2 is a cross-sectional view of a second embodiment of the magnetic field sensor device.

A cross-sectional view of a second embodiment of the magnetic field sensor device is shown in the illustration of FIG. 2. Only the differences from the illustration of FIG. 1 will be explained below. An electrically conductive, preferably metallic layer 60 is formed in substrate layer 32 below Hall plate 40. The electrically conductive layer is preferably connected to a ground (not shown). An electrically conductive cover plate 70, preferably made as a metallic plate, is arranged above Hall plate 40, whereby cover plate 70 is electrically isolated from Hall plate 40 and preferably connected to a reference potential (not shown). In an embodiment that is not shown, a cover layer is provided between Hall plate 40 and cover plate 70. The cover layer preferably comprises compounds of silicon dioxide and/or silicon-boron-nitride and/or silicon-nitride and/or polyimide and forms a materially bonded contact with Hall plate 40.

In the illustrated embodiment, cover plate 70 lies on contact areas 50 and is connected force-fittingly with contact areas 50. It is preferable that cover plate 70 completely covers Hall plate 40 and is spaced apart from it. Stated differently, a gap 72 is formed between cover plate 70 and Hall plate 40. An advantage of the electrical connection of metallic layer 60 and/or cover plate 70 to ground and/or the reference potential is that the operating point of the Hall plate can be set by means of a change in the voltage level of ground and/or of the reference potential. In particular, whether the Hall voltage in Hall plate 60 is generated by electrons or holes can be set in metallic layer 60 and/or in cover plate 70 by means of the voltage level. Further, by means of a circuit unit the level of the voltage in metallic layer 60 and/or in cover plate 70 can be changed in order to reduce or compensate completely hereby a temperature response of Hall plate 70. A further advantage is that parasitic electrical fields and the effect of the parasitic fields on the Hall plate can be suppressed by means of metallic layer 60 and/or cover plate 70. It should be noted that an operating potential can be applied to substrate layer 32, instead of an effect on Hall plate 60 by means of the level or the change in the level of the ground in metallic layer 60. It is disadvantageous hereby that the electronic components formed in the substrate layer are affected. Further, Hall plate 40 can be protected from an effect of the molding compound or a potting compound in a subsequent molding process by the arrangement of cover plate 70.

Figure 3:
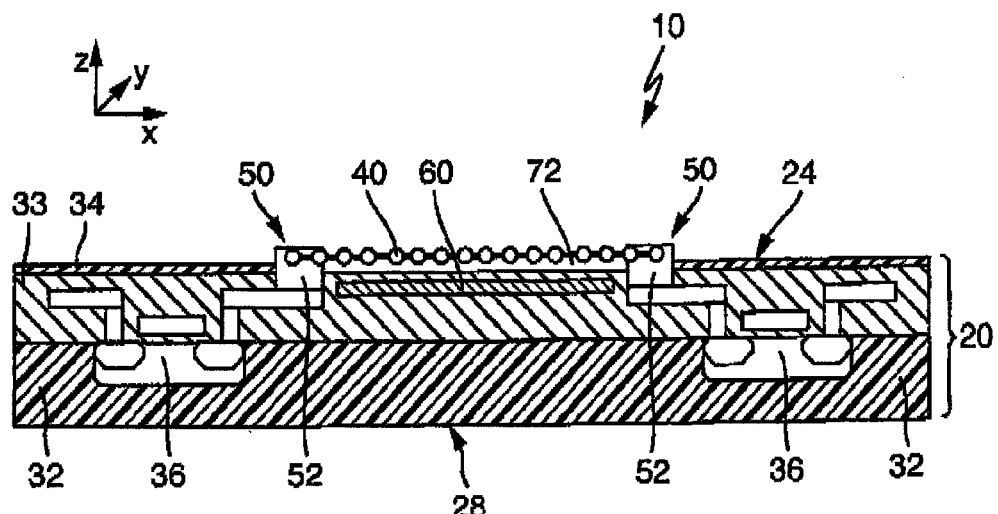
FIG. 3 is a cross-sectional view of a third embodiment of the magnetic field sensor device.

A cross-sectional view of a third embodiment of the magnetic field sensor device is shown in the illustration of FIG. 3. For reasons of clarity, cover layer 70 is not shown. Only the differences from the illustrations in the previous figures will be explained below. A gap is formed between substrate layer 32 and Hall plate 40 or the graphene layer, so that the graphene layer between contact areas 50 is spaced apart from top side 24 of semiconductor body 20. Stated differently, Hall plate 40 is fixed in contact areas 50 in such a way that a gap forms between Hall plate 40 and top side 24 in the area between contact areas 50. It became evident that the effective charge carrier mobility can be greatly increased with the formation of a gap. In a further embodiment that is not shown, the gap is formed above the cover layer.

Figure 4:
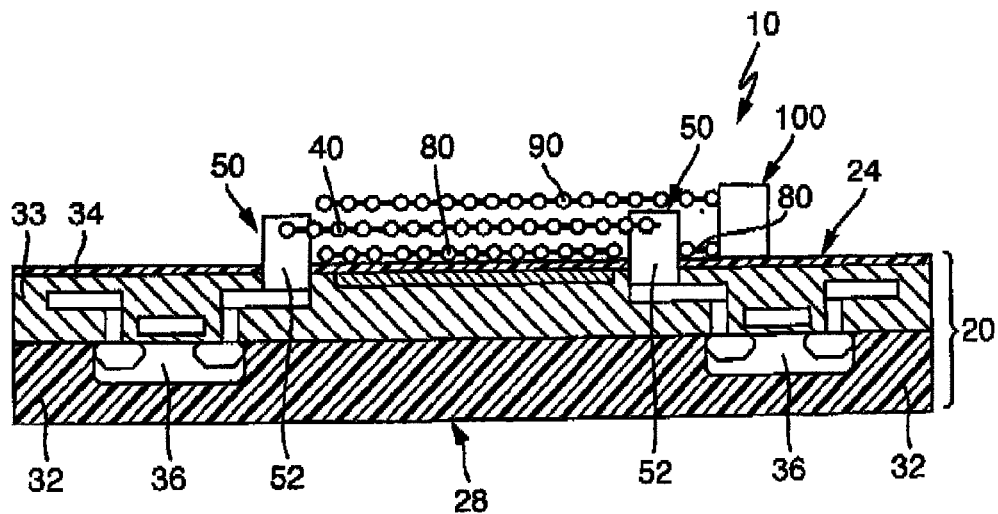
FIG. 4 is a cross-sectional view of a fourth embodiment of a magnetic field sensor device.

A cross-sectional view of a fourth embodiment of the magnetic field sensor device is shown in the illustration of FIG. 4. Only the differences from the illustrations in the previous figures will be explained below. A further graphene layer 80 is formed between passivation layer 36 and Hall plate 40. It is preferred that the further graphene layer 80 below Hall plate 40 has no electrical functional connection with Hall plate 40. Preferably, the further graphene layer 80 is connected to substrate layer 36 (not shown). Further, a graphene cover layer 90 is formed above Hall plate 40. Graphene cover layer 90 is connected by means of an electrical connecting region 100 to substrate layer 36. It should be noted that the further graphene layer 80 as well as graphene cover layer 90 are made of one or more graphene monolayers.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field sensor device comprising:
   a semiconductor body with a top side and a bottom side, the semiconductor body having a substrate layer and a passivation layer formed above the substrate layer on the top side of the semiconductor body;
   at least one electronic component formed in the substrate layer; and
   a Hall plate arranged on the top side of the semiconductor body above the passivation layer,
      wherein the Hall plate is formed of a graphene compound, and
      wherein a graphene monolayer or a plurality of graphene monolayers and/or a silicon-boron-nitride layer or a Morality of silicon-boron-nitride layers are arranged between the Hall plate and the passivation layer.

2. The magnetic field sensor device according to claim 1, wherein the Hall plate has four spaced-apart contacts and is electrically connected to the substrate layer via the contacts.

3. The magnetic field sensor device according to claim 1, wherein the Hall plate comprises a two-dimensional graphene layer, so that a current flow occurs substantially only parallel to the layer plane.

4. The magnetic field sensor device according to claim 1, wherein the Hall plate comprises a plurality of graphene monolayers.

5. The magnetic field sensor device according to claim 1, wherein the Hall plate has precisely one graphene monolayer.

6. The magnetic field sensor device according to claim 1, wherein an electrically conductive shielding layer is formed within the passivation layer or within a trace layer and below the Hall plate and/or above the Hall plate.

7. The magnetic field sensor device according to claim 6, wherein the shielding layer is formed as a metallic cover plate on a side facing away from the substrate layer of the graphene layer, and covers the graphene layer.

8. The magnetic field sensor device according to claim 6, wherein the shielding layer is supplied with a reference potential or with ground.

9. The magnetic field sensor device according to claim 6, wherein an electrical functional connection is formed between the shielding layer and a circuit unit.

10. The magnetic field sensor device according to claim 9, wherein the shielding layer is formed as a control electrode for influencing the sensitivity of the Hall plate, and wherein a level of the potential in the shielding layer is changed by the circuit unit.

11. The magnetic field sensor device according to claim 1, wherein the electronic components comprise MOS transistors and the MOS transistors have an electrical functional connection with the Hall plate.

12. The magnetic field sensor device according to claim 1, wherein the semiconductor body is arranged force-fittingly with its bottom side on a metallic support plate.

13. The magnetic field sensor device according to claim 1, wherein the semiconductor body and the Hall plate are arranged in a mutual IC package.

14. The magnetic field sensor device according to claim 1, wherein the Hall plate is attached and electrically connected only at an edge region.

15. A magnetic field sensor device comprising:
   a semiconductor body with a top side and a bottom side, the semiconductor body having a substrate layer and a passivation layer formed above the substrate layer on the top side of the semiconductor body;
   at least one electronic component formed in the substrate layer; and
   a Hall plate arranged on the top side of the semiconductor body above the passivation layer,
      wherein the Hall plate is formed of a graphene compound, and
      wherein a graphene monolayer or a plurality of graphene monolayers and/or a silicon-boron-nitride layer or a plurality of silicon-boron-nitride layers are arranged above the Hall plate.

16. A magnetic field sensor device comprising:
   a semiconductor body with a top side and a bottom side, the semiconductor body having a substrate layer and a passivation layer formed above the substrate layer on the top side of the semiconductor body;
   at least one electronic component formed in the substrate layer; and
   a Hall plate arranged on the top side of the semiconductor body above the passivation layer,
      wherein the Hall plate is formed of a graphene compound, and
      wherein the semiconductor body comprises a silicon compound and the passivation layer a silicon-boron-nitride compound.

* * * * *